United States Patent
Yoshida et al.

(10) Patent No.: US 10,917,116 B2
(45) Date of Patent: Feb. 9, 2021

(54) ERROR CORRECTION DEVICE AND ERROR CORRECTION METHOD

(71) Applicant: Mitsubishi Electric Corporation, Tokyo (JP)

(72) Inventors: Hideo Yoshida, Tokyo (JP); Kazuo Kubo, Tokyo (JP); Kenji Ishii, Tokyo (JP); Kenya Sugihara, Tokyo (JP); Takashi Sugihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/491,097

(22) PCT Filed: Mar. 9, 2017

(86) PCT No.: PCT/JP2017/009569
§ 371 (c)(1),
(2) Date: Sep. 4, 2019

(87) PCT Pub. No.: WO2018/163374
PCT Pub. Date: Sep. 13, 2018

(65) Prior Publication Data
US 2020/0021311 A1  Jan. 16, 2020

(51) Int. Cl.
*H03M 13/00* (2006.01)
*H03M 13/19* (2006.01)
(Continued)

(52) U.S. Cl.
CPC ....... *H03M 13/19* (2013.01); *H03M 13/1134* (2013.01); *H03M 13/255* (2013.01); *H03M 13/271* (2013.01); *H03M 13/2778* (2013.01)

(58) Field of Classification Search
None
See application file for complete search history.

(56) References Cited

U.S. PATENT DOCUMENTS

| 6,731,670 B1 * | 5/2004 | Kido | H03K 3/84 375/140 |
| 8,949,448 B1 * | 2/2015 | Saxtorph | H04L 69/28 709/230 |

(Continued)

FOREIGN PATENT DOCUMENTS

JP  8-279799 A  10/1996

OTHER PUBLICATIONS

ITU-T Recommendation G.975 (Oct. 2000), "Forward error correction for submarine systems", total 21 pages.
(Continued)

*Primary Examiner* — Mujtaba M Chaudry
(74) *Attorney, Agent, or Firm* — Birch, Stewart, Kolasch & Birch, LLP

(57) ABSTRACT

Provided is an error correction device including an encoding circuit configured to encode a plurality of error correction code sequences, in which the encoding circuit includes a plurality of encoding circuits connected in parallel, and is configured to execute encoding processing for the plurality of error correction code sequences through use of all the plurality of encoding circuits by adjusting an output bus width and a frequency of an operation clock with respect to a difference in transmission rate for any payloads input in one or more systems.

9 Claims, 5 Drawing Sheets

(51) Int. Cl.
*H03M 13/11* (2006.01)
*H03M 13/25* (2006.01)
*H03M 13/27* (2006.01)

(56) References Cited

U.S. PATENT DOCUMENTS

| | | | |
|---|---|---|---|
| 2003/0043926 A1* | 3/2003 | Terashima | H04L 25/14 |
| | | | 375/257 |
| 2004/0139383 A1* | 7/2004 | Salvi | H03M 13/2972 |
| | | | 714/759 |
| 2005/0210363 A1* | 9/2005 | Cadic | H03M 13/23 |
| | | | 714/781 |
| 2006/0251126 A1* | 11/2006 | Jen | H04L 65/607 |
| | | | 370/503 |
| 2012/0257014 A1* | 10/2012 | Tsukagoshi | H04N 21/4348 |
| | | | 348/43 |
| 2015/0294640 A1* | 10/2015 | Lei | H04N 5/14 |
| | | | 348/445 |

OTHER PUBLICATIONS

Iyengar et al. "Windowed Decoding of Spatially Coupled Codes", 2011 IEEE International Symposium on Information Theory Proceedings, Aug. 2011, pp. 2552-2556.

Iyengar et al. "Windowed Decoding of Spatially Coupled Codes", IEEE Transactions on Information Theory, vol. 59, No. 4, Apr. 2013, pp. 2277-2292.

Kudekar et al. "Threshold Saturation via Spatial Coupling: Why Convolutional LDPC Ensembles Perform So Well over the BEC", IEEE Transactions on Information Theory, vol. 57, No. 2, Feb. 2011, pp. 803-834.

* cited by examiner

ERROR CORRECTION DEVICE AND ERROR CORRECTION METHOD

TECHNICAL FIELD

The present invention relates to an error correction device and error correction method for executing encoding processing and decoding processing for various transmission rates (throughputs).

BACKGROUND ART

In general, an optical transmission system and other high-speed transmission devices employ an error correction code as an effective method for achieving a high transmission capacity and long-distance transmission. The error correction code is a technology used in, for example, a wired/wireless communication system and a storage device. The error correction code is a technology for adding a redundant bit to digital data to be transmitted on a transmission side, to thereby enable correction of an error (bit) that has occurred in received data.

As error correction encoding/decoding methods, various kinds of methods are proposed, such as Hamming codes, Bose-Chaudhuri-Hocquenghem (BCH) codes, Reed-Solomon (RS) codes, and product codes and concatenated codes obtained by combining those codes.

It is possible to detect and correct an error that has occurred in a transmission path by employing an error correction code. However, there is a limitation on the number of error bits that can be corrected. Further, the number of error bits that can be corrected differs depending on the error correction performance and decoding method of an error correction encoding method.

In an error correction code, transmission data containing an overhead and other information forming a frame is called "information bit". Further, a redundant bit added to an information bit is called "parity bit". The parity bit is calculated from an information bit by a calculation method that differs depending on the error correction encoding method. Further, a bit string obtained by combining an information bit and a parity bit is called "codeword".

In an error correction code called "block code", a parity bit is calculated from an information bit in units of the number of bits set in advance. That is, the number of information bits and the number of parity bits are determined in advance within one codeword, and are called "information bit length" and "parity bit length", respectively. Further, the number of bits of a codeword is called "code length".

A metro core optical transfer system to be used for a submarine cable and intercity communication has a significant demand for expanding the transmission capacity and transmission distance. As a result, sophisticated error correction codes are being employed and proposed on a daily basis.

In recent years, a low-density parity-check (LDPC) code has been widely used as the error correction code. The LDPC code is a block code defined by a sparse parity-check matrix with a small number of non-zero elements.

Further, as a technique for achieving improvement of error correction performance of an LDPC code, for example, a spatially-coupled forward error correction (FEC) configuration is proposed (for example, refer to Non-Patent Literatures 1 and 2).

In such a spatially-coupled FEC configuration, a spatially-coupled LDPC code is used. The spatially-coupled LDPC code is one type of LDPC convolutional code, and is obtained by applying basic structure of an LDPC convolutional code to change the code sequence from a continuous type to an end-of-block (EOB) type.

In the spatially-coupled LDPC code, check submatrices are used to construct submatrices of a spatially-coupled LDPC code, and a plurality of those check submatrices are diagonally coupled to construct one check matrix. One check matrix constructed in this manner serves as a check matrix of the spatially-coupled LDPC code.

In Non-Patent Literature 1, there is a description that a belief propagation (BP) decoding method is used to achieve high error correction performance close to the theoretical limit. Further, in Non-Patent Literature 2, application of windowed decoding to a spatially-coupled LDPC code is proposed as a method of suppressing delay and increase in circuit scale.

Meanwhile, in order to handle a burst error, a configuration of performing interleaving before and after an error correction code sequence to distribute the burst error across a plurality of error correction code sequences is employed in many cases.

In Non-Patent Literature 3, a plurality of encoding circuits or decoding circuits are prepared for RS (255, 239), which is a Reed-Solomon (RS) code, and a demultiplexer and a multiplexer are arranged before and after those circuits so that a plurality of RS code sequences are subjected to interleaving in units of byte with respect to a transmission direction.

Decoding of an LDPC code exhibits a high correction capability by repetitive decoding of row calculation and column calculation as represented by a BP decoding method described in Non-Patent Literature 1 and Non-Patent Literature 2.

Further, as described in Non-Patent Literature 3, a plurality of error correction encoding circuits or a plurality of decoding circuits are arranged to achieve burst error tolerance through interleaving.

CITATION LIST

Non Patent Literature

[NPL 1] S. Kudekar, T. Richardson, and R. L. Urbanke, "Threshold saturation via spatial coupling: Why convolutional LDPC ensembles perform so well over the BEC," IEEE Trans. Inf. Theory, vol. 57, no. 2, pp. 803-834, February 2011.

[NPL 2] A. R. Iyengar, P. H. Siegel, R. L. Urbanke and J. K. Wolf, "Windowed decoding of spatially coupled codes," Proc. 2011 IEEE Int. Symp. Inf. Theory (ISIT), pp. 2552-2556, August 2011.

[NPL 3] ITU-T Recommendation G.975 (October 2000)

SUMMARY OF INVENTION

Technical Problem

However, the related arts have the following problems.

In an optical transmission system of recent years, the system accommodates signals at a wide variety of client rates due to expansion of the transmission capacity. For example, in an IEEE system, Flex Ethernet (trademark), which supports 200 GbE or 400 GbE as the transmission capacity of 100 GbE or more and can flexibly accommodate signals, is progressively standardized.

Further, in an ITU-T system, ITU-T Recommendations G.709/Y.1331 are progressively standardizing a frame format (OTUCn) that can be used in an interface of up to the maximum of 25.6 Tb/s in units of n×100 G (n is an integer) as an optical transmission network of more than 100 G. An optical transceiver included in an optical transmission device is required to have a function of flexibly accommodating a plurality of those client signals and transmitting signals to a line side at the same rate.

In Non-Patent Literature 1, the BP decoding method is proposed to be used to achieve high error correction performance. Further, in Non-Patent Literature 2, spatially-coupled LDPC encoding and windowed decoding are proposed to be used to achieve high error correction performance with a small circuit scale that has relatively suppressed complexity. However, none of the related arts proposes a configuration that can handle various transmission rates.

Further, an LDPC convolutional code like a spatially-coupled LDPC code handles code sequences continuously. Thus, past code sequences or intermediate values based on decoding results are usually required to be continuously used. In this case, it is difficult to process a plurality of LDPC code sequences by one encoding circuit or one decoding circuit.

In short, the related-art error correction circuit has not hitherto considered handling various transmission rates.

In Non-Patent Literature 3, there is described a method involving arranging a plurality of error correction circuits between a demultiplexer and a multiplexer and executing interleaving. However, in Non-Patent Literature 3, there is no description of specific processing to be executed when a plurality of frames are input at the same time in order to handle various transmission rates.

Thus, in Non-Patent Literature 3, a plurality of error correction circuits are arranged between a demultiplexer and a multiplexer for each frame, resulting in a large circuit scale.

In particular, regarding a code sequence without limitation on its code length, for example, an LDPC convolutional code sequence, intermediate values are required to be held continuously in each of encoding and decoding. Thus, an increase in number of code sequences leads to an increase in number of circuits holding intermediate values.

The present invention has been made in order to solve the above-mentioned problems, and has an object to provide an error correction device and an error correction method, which achieve performance and quality that depend on various transmission rates and transmission distances while suppressing a circuit scale.

Solution to Problem

According to one embodiment of the present invention, there is provided an error correction device including at least one of: an encoding circuit configured to encode a plurality of error correction code sequences; and a decoding circuit configured to decode the plurality of error correction code sequences, wherein the encoding circuit includes a predetermined plurality of encoding circuits connected in parallel, and is configured to execute encoding processing for the plurality of error correction code sequences through use of all the predetermined plurality of encoding circuits by adjusting an output bus width and a frequency of an operation clock with respect to a difference in transmission rate for any one of a payload input in one system and payloads input in two or more systems, and wherein the decoding circuit includes a predetermined plurality of decoding circuits connected in parallel, and is configured to execute decoding processing for the plurality of error correction code sequences through use of all the predetermined plurality of decoding circuits by adjusting an output bus width and a frequency of an operation clock with respect to a difference in transmission rate for any one of a payload input in one system and payloads input in two or more systems.

According to one embodiment of the present invention, there is provided an error correction method, which is executed by an error correction device including at least one of: an encoding circuit configured to encode a plurality of error correction code sequences; and a decoding circuit configured to decode the plurality of error correction code sequences, the error correction method including: an encoding step of executing, by the encoding circuit, encoding processing for the plurality of error correction code sequences through use of parallel processing using all a predetermined plurality of encoding processing units by adjusting an output bus width and a frequency of an operation clock with respect to a difference in transmission rate for anyone of a payload input in one system and payloads input in two or more systems; and a decoding step of executing, by the decoding circuit, decoding processing for the plurality of error correction code sequences through use of parallel processing using all a predetermined plurality of decoding processing units by adjusting an output bus width and a frequency of an operation clock with respect to a difference in transmission rate for any one of a payload input in one system and payloads input in two or more systems.

Advantageous Effects of Invention

According to the present invention, there is provided the configuration of including the predetermined plurality of encoding circuits or decoding circuits in parallel, and executing the encoding processing or the decoding processing through use of the parallel processing using all the predetermined plurality of those circuits irrespective of the transmission rate or simultaneous input of a plurality of frames. As a result, it is possible to provide the error correction device and the error correction method, which achieve performance and quality that depend on various transmission rates and transmission distances while suppressing a circuit scale.

DESCRIPTION OF EMBODIMENTS

Now, a description is given of an error correction device and error correction method according to preferred embodiments of the present invention with reference to the drawings.

First Embodiment

Figure 1:
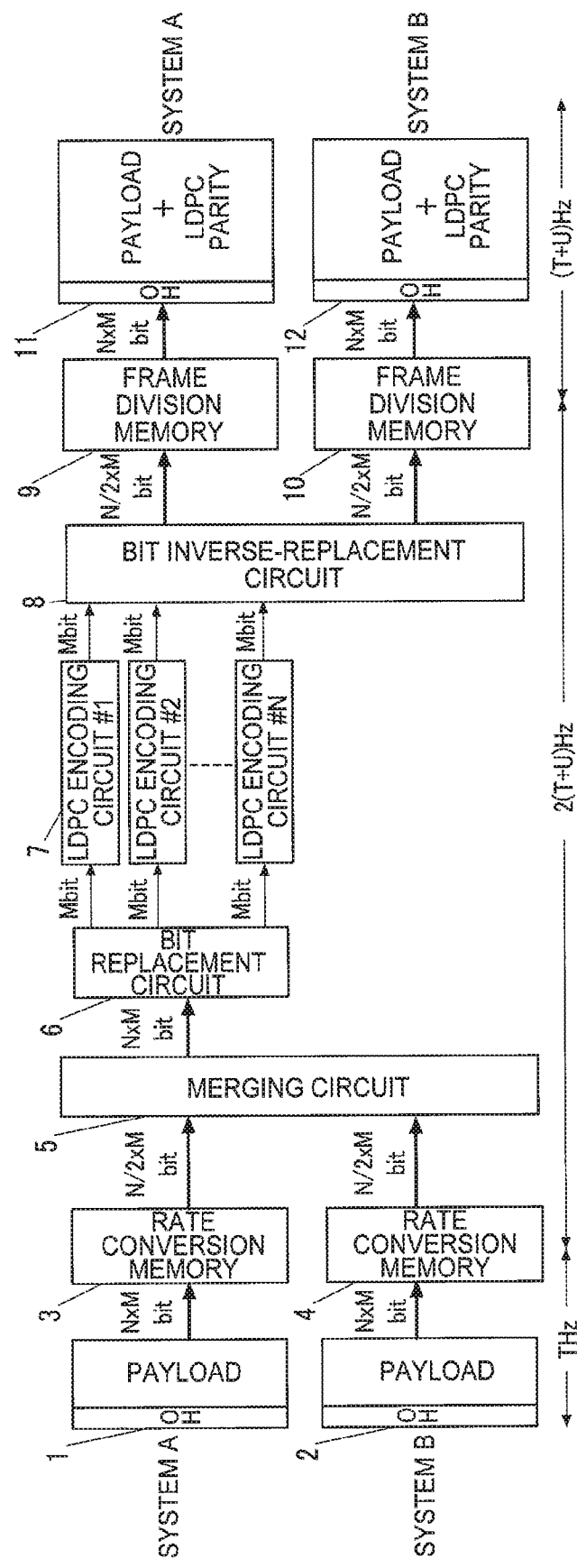
FIG. 1 is a block diagram for illustrating an exemplary configuration of an encoding circuit of an error correction device according to a first embodiment of the present invention.

FIG. 1 is a block diagram for illustrating an exemplary configuration of an encoding circuit of an error correction device according to a first embodiment of the present invention. In FIG. 1, there is exemplified a case in which respective pieces of frame data in two systems, which exhibit twice the transmission rate of input in one system, are input to a system A and a system B in parallel.

An error correction encoding circuit of the error correction device includes rate conversion memories 3 and 4, a merging circuit 5, a bit replacement circuit 6, a plurality of LDPC encoding circuits 7, a bit inverse-replacement circuit 8, and a frame division memory 9. The error correction encoding circuit having such a configuration executes encoding processing for a plurality of payloads 1 and 2, which are input at a certain transmission rate, to thereby output frames 11 and 12, into which a payload and an LDPC parity are inserted with an OH set at the top similarly to the input.

The rate conversion memories 3 and 4 replace clocks or insert parity regions of LDPC code sequences for the plurality of payloads 1 and 2. Herein, the phrase "replace clocks" means switching the frequency of an operation clock to change the transmission rate of output from the rate conversion memories 3 and 4.

The merging circuit 5 merges pieces of data in accordance with transmission rates of output from the respective rate conversion memories 3 and 4. The bit replacement circuit 6 executes interleaving for the combined data. The plurality of LDPC encoding circuits 7 execute LDPC encoding processing for N pieces of M-bit data obtained by interleaving.

The bit inverse-replacement circuit 8 executes de-interleaving, which is an operation opposite to that of the bit replacement circuit 6, for the pieces of M-bit data output from the plurality of LDPC encoding circuits 7. Then, the frame division memories 9 and 10 divide output of the bit inverse-replacement circuit 8 into two payload frames to be transmitted. Now, a description is given in detail of an exemplary encoding configuration of the error correction device with reference to FIG. 1.

In FIG. 1, the plurality of payloads 1 and 2 are input to the rate conversion memories 3 and 4, respectively, at the frequency of T Hz supporting transmission of a frame containing an overhead (OH) and a payload, for example, frame synchronization.

In the rate conversion memories 3 and 4, clocks are replaced, and data is output through overclocking (2×(T+U) Hz), which supports simultaneous input in two systems, in consideration of overclocking (U Hz) for insertion of a parity into an LDPC code sequence, for example.

In the first embodiment, the number of parity bits of an LDPC code to be inserted into the middle is assumed to be a multiple of M bits. Further, regarding input/output of each system in the rate conversion memories 3 and 4, the input from a payload is set to be N×M bits (N is an even number) and the output is set to be N/2×M bits.

Figure 2:
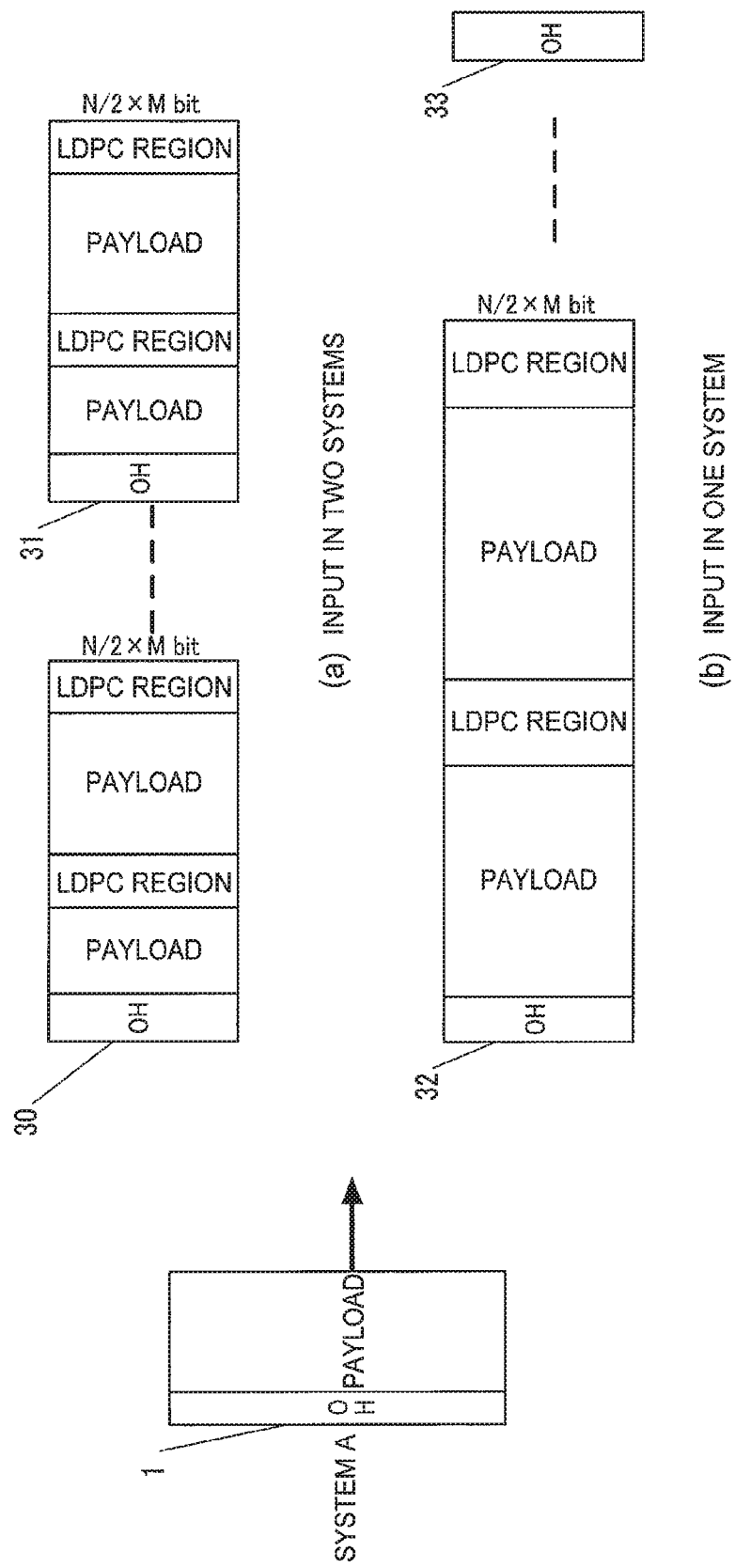
FIG. 2 is a diagram for illustrating an exemplary configuration of a frame to be output from rate conversion memories of FIG. 1 in the first embodiment of the present invention.

FIG. 2 is a diagram for illustrating an exemplary configuration of a frame to be output from the rate conversion memories 3 and 4 of FIG. 1 in the first embodiment of the present invention. Frames 30 and 31 are each an illustration of the configuration of a frame to be output at the time of input in two systems. Meanwhile, frames 32 and 33 are each an illustration of the configuration of a frame to be output at the time of input in only one system.

In the LDPC code sequence, periodically, an OH is output at the top, and after that, a payload sequence and a parity sequence are output alternately. Thus, frames have a configuration in which an LDPC parity region is inserted into the middle of an input payload region, and are output from the rate conversion memories 3 and 4.

A period in a case where frames are input in only one system is twice the length of a period in a case where frames are input in two systems.

From the periodical point of view, the OH is not required to be set at the top after output of an LDPC parity region, but is desired to be set at the top for synchronization of frames. Further, there is an advantage that control of output frames is facilitated by assuming that the number of LDPC parity bits is a multiple of M bits.

The two frames output from the rate conversion memories 3 and 4 as N/2×M bits are merged by the merging circuit 5 of FIG. 1, and output as an N×M-bit frame. In the case of input in one system, the merging circuit 5 merges frames equivalent to a period of two clocks, which are obtained from the system, and outputs an N×M-bit frame.

Next, the bit replacement circuit 6 of FIG. 1 replaces bits so that the N×M-bit frame combined by the merging circuit 5 is subjected to bit interleaving. At this time, the bit replacement circuit 6 may replace bits so that bits of the two systems are mixed in one LDPC code sequence, or may replace bits within a range of N/2×M bits so that the bits of the respective systems are subjected to interleaving independently of each other.

The N×M-bit frame output from the bit replacement circuit 6 is divided into N frames in units of M bits, and those N frames are input to the respective N LDPC encoding circuits 7. Each of the N LDPC encoding circuits 7 executes LDPC encoding based on a predetermined rule, and outputs an OH or a payload sequence as well as a parity bit, which is output to the LDPC parity region, in a predetermined period.

In the case of input in one system, each of the N LDPC encoding circuits 7 executes the LDPC encoding processing for frames equivalent to the period of two clocks, and outputs the result.

The LDPC-encoded sequences output from the N LDPC encoding circuits 7 as M bits are input to the bit inverse-replacement circuit 8. Then, the bit inverse-replacement circuit 8 executes an operation opposite to that of the bit replacement circuit 6, that is, executes a deinterleaving operation, and outputs N/2×M-bit data for each system.

In the case of input in one system, the bit inverse-replacement circuit 8 receives an N×M-bit encoded sequence, and divides the N×M-bit encoded sequence into two pieces of N/2×M-bit data for output.

The two pieces of N/2×M-bit data in two systems, which have been output from the bit inverse-replacement circuit 8, are input to the respective frame division memories 9 and 10. The frequency of the input clock has been so far 2×(T+U) Hz.

Meanwhile, the bit width of output from the frame division memories 9 and 10 is N×M bits similarly to the input frames 1 and 2. Then, the frames 11 and 12, into which a payload and an LDPC parity are inserted with the OH set at the top similarly to the case of input, are output from the frame division memories 9 and 10, respectively. The clock frequencies of the frames 11 and 12 output from the frame division memories 9 and 10 are each (T+U) Hz, which considers insertion of an LDPC parity.

As described above, the same number of LDPC encoding circuits configured in parallel execute the encoding processing for any one of input in one system and input in two systems, which has a transmission speed different from that of the input in one system, to thereby enable execution of LDPC convolutional encoding processing, which is continuous. As a result, even an LDPC convolutional code sequence without limitation on the code length can be flexibly handled at a plurality of throughputs without increasing the circuit scale.

Further, interleaving can be implemented by replacing bits among data buses to which frames are input in parallel. Thus, interleaving processing can be executed at a low latency without requiring a memory for interleaving processing, and most of a delay due to the interleaving processing can be eliminated.

Therefore, it is possible to implement an error correction device for an LDPC convolutional code sequence having an interleaving function at a low latency even for a plurality of code sequences, which achieves performance and quality that depend on various transmission rates and transmission distances while suppressing a circuit scale.

In the first embodiment, input in one system and input in two systems have been described as a specific example of pieces of data having a different transmission speed. However, it is possible to execute the encoding processing with a similar configuration even when the number of input systems increases.

The number of input systems is desired to be an exact divisor of the number of parallel LDPC encoding circuits. However, even when the number of input systems is not an exact divisor of the number of parallel LDPC encoding circuits, it is conceivable that the number of input systems is rounded up to the exact divisor, and a redundant code sequence that cannot be handled by the input systems is treated as a dummy sequence. In this case, the dummy sequence may not be subjected to bit replacement of interleaving, and it suffices that the dummy sequence is processed not to be operated through use of an enable signal after the LDPC encoding circuit 7.

Further, in the first embodiment, a description has been given of a case of handling the transmission speed of two systems under the following conditions in addition to input in two systems.

The operation frequency is set to be twice in a section of from output of the rate conversion memories 3 and 4 to input of the frame division memories 9 and 10 in consideration of insertion of an LDPC parity.

The output bus width of each system is set to be N/2×M bits.

The input/output width of each LDPC encoding circuit 7 is set to be M bits.

However, when the total number of output bit widths of "operation frequency×each system" is equal to or larger than the transmission speed, encoding processing that depends on the number of input systems can be implemented without being limited to the above-mentioned conditions. For example, it is possible to handle simultaneous input in four systems by satisfying the following conditions.

The operation frequency is set to be twice or more.

The output bus width of each system is set to be N/2×M bits.

The output width of the merging circuit 5 is set to be N×2M bits.

The input/output width of each LDPC encoding circuit 7 is set to be 2M bits.

Further, in the first embodiment, a description has been given on the assumption that the number of LDPC parity bits to be inserted into the middle is a multiple of M. However, it is possible to employ the configuration of using the number of LDPC parity bits other than a multiple of M by modifying write or read by the rate conversion memories 3 and 4. However, in such a case, it is desired that a head reference point be enabled to be set in, for example, a frame header.

Second Embodiment

Figure 3:
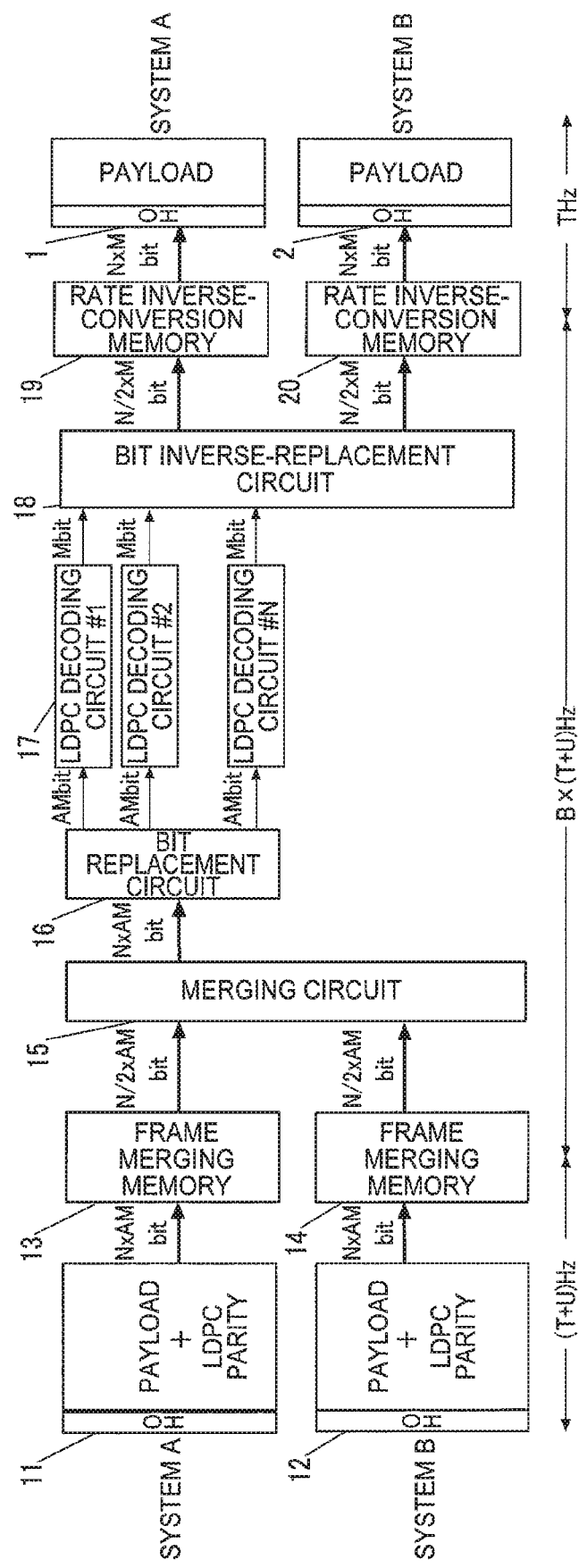
FIG. 3 is a block diagram for illustrating an exemplary configuration of a decoding circuit of an error correction device according to a second embodiment of the present invention.

In a second embodiment of the present invention, an exemplary configuration of a decoding circuit of an error correction device is described in association with the first embodiment. FIG. 3 is a block diagram for illustrating an exemplary configuration of a decoding circuit of an error correction device according to a second embodiment of the present invention. In FIG. 3, there is exemplified a case in which, similarly to the first embodiment, respective pieces of LDPC encoded frame data in two systems, which exhibit twice the transmission rate of input in one system, are input to a system A and a system B in parallel.

An error correction decoding circuit of the error correction device includes frame merging memories 13 and 14, a merging circuit 15, a bit replacement circuit 16, a plurality of LDPC decoding circuits 17, a bit inverse-replacement circuit 18, and a rate inverse-conversion memory 19. The error correction decoding circuit having such a configuration executes decoding processing for a plurality of payloads 11 and 12, which are input at a certain transmission rate, include an OH, and is added with an LDPC code parity, to thereby output two payloads 1 and 2 with an OH set at the top similarly to the input.

The respective frame merging memories 13 and 14 replace clocks for the input payloads 11 and 12. Herein, the phrase "replace clocks" means switching the frequency of the operation clock to change the transmission rate of output from the frame merging memories 13 and 14.

The merging circuit 15 merges pieces of data in accordance with transmission rates of output from the respective frame merging memories 13 and 14. The bit replacement circuit 16 executes interleaving for the combined data. The plurality of LDPC decoding circuits 17 execute LDPC decoding processing for N pieces of AM-bit data obtained by interleaving.

The bit inverse-replacement circuit 18 executes de-interleaving, which is an operation opposite to that of the bit replacement circuit 16, for the pieces of M-bit data output from the plurality of LDPC decoding circuits 17. Then, the rate inverse-conversion memories 19 and 20 divide output of the bit inverse-replacement circuit 18 into two payload frames. Now, a description is given in detail of an exemplary decoding configuration of the error correction device with reference to FIG. 3.

In FIG. 3, the plurality of payloads 11 and 12 are input to the frame merging memories 13 and 14, respectively, at the frequency of (T+U) Hz supporting transmission of a frame containing an overhead (OH), a payload, and an LDPC parity, for example, frame synchronization.

The frame merging memories 13 and 14 execute replacement of clocks. In the second embodiment, regarding data input from the payloads 11 and 12, input/output by the frame merging memories 13 and 14 in respective systems is soft-decision data as represented by LLR representing one bit of information by A bit, and is input in units of N×AM bits (N is an even number), whereas data is output in units of N/2×AM bits.

Further, data is output from the frame merging memories 13 and 14 through overclocking (B×(T+U) Hz), which supports simultaneous input in two systems. In this case, B is desired to be a positive number of 2 or more, but is not limited thereto. Further, when the bus width is increased, B may be less than 2.

Further, output from the frame merging memories 13 and 14 is desired to be burst output with a payload and LDPC parity including an OH, which are an LDPC code sequence, serving as a block. However, the manner of output is not limited thereto.

The frames output from the frame merging memories 13 and 14 as N/2×AM bits are merged by the merging circuit 15 of FIG. 3, and output as N×AM bits. In the case of input in one system, the merging circuit 15 merges frames equivalent to a period of two clocks, which are obtained from the system, and outputs an N×AM-bit frame.

Next, the bit replacement circuit 16 of FIG. 3 executes replacement so that the N×AM-bit frame combined by the merging circuit 15 is subjected to bit interleaving. At this time, the bit replacement circuit 16 executes interleaving processing by using the same bit replacement rule as that of the bit replacement circuit 6 in the encoding processing.

The N×AM-bit frame output from the bit replacement circuit 16 is divided in units of AM bits, and input to each of the N LDPC decoding circuits 17. Each of the N LDPC decoding circuits 17 repeatedly executes decoding processing until the next payload and LDPC parity including an OH, which serve as a block, are input.

In the case of input in one system, a period in which the next payload and LDPC parity are input is twice the period in the case of input in two systems. Thus, each of the N LDPC decoding circuits 17 increases the number of repetitions of decoding, or can increase the windowe width of windowed decoding when the block is an LDPC convolutional code sequence.

The LDPC encoded sequences after being subjected to error correction output from the N LDPC decoding circuits 17 as M bits are input to the bit inverse-replacement circuit 18. Then, the bit inverse-replacement circuit 18 executes an operation opposite to that of the bit replacement circuit 16, that is, executes a deinterleaving operation, and outputs N/2×M-bit data for each system.

At this time, in the case of input in one system, all the pieces of N×M-bit data input to the bit inverse-replacement circuit 18 are data in one system. Thus, in this case, the bit inverse-replacement circuit 18 includes a buffer, and is set to be capable of outputting N/2×M-bit data in one clock.

The two pieces of N/2×M-bit data in two systems, which have been output from the bit inverse-replacement circuit 18, are input to the respective rate inverse-conversion memories 19 and 20. The frequency of the input clock has been so far B×(T+U) Hz.

Meanwhile, the bit width of output from the rate inverse-conversion memories 19 and 20 is N×M bits similarly to the input frames 1 and 2. Then, the frames 1 and 2, from which an LDPC parity is removed so that a payload remains, are inserted with the OH set at the top similarly to the case of input, are output from the rate inverse-conversion memories 19 and 20, respectively. The clock frequencies of the frames 1 and 2 output from the rate inverse-conversion memories 19 and 20 are each T Hz.

As described above, the same number of LDPC decoding circuits configured in parallel execute the decoding processing for any one of input in one system and input in two systems, which has a transmission speed different from that of the input in one system, to thereby enable execution of LDPC convolutional decoding processing, which is continuous. As a result, even an LDPC convolutional code sequence without limitation on the code length can be flexibly handled at a plurality of throughputs without increasing the circuit scale.

Further, interleaving can be implemented by replacing bits among data buses to which frames are input in parallel. Thus, interleaving processing can be executed at a low latency without requiring a memory for interleaving processing, and most of a delay due to the interleaving processing can be eliminated.

Therefore, it is possible to implement an error correction device for an LDPC convolutional code sequence having an interleaving function at a low latency even for a plurality of code sequences, which achieves performance and quality that depend on various transmission rates and transmission distances while suppressing a circuit scale.

Similarly to the encoding processing in the first embodiment, the following effects can be obtained also in the decoding processing in the second embodiment.

Most of a delay due to the interleaving processing can be eliminated.

The decoding processing can be executed with a similar configuration even when the number of input systems increases.

The decoding processing can be executed by adopting a dummy sequence even when the number of input systems is not an exact divisor of the number of parallel LDPC decoding circuits.

Third Embodiment

In the first embodiment, a description has been given of an exemplary configuration of the error correction device including an encoding circuit for an LDPC code in input in a plurality of systems. Similarly, in the second embodiment, a description has been given of an exemplary configuration of the error correction device including a decoding circuit for an LDPC code in input in a plurality of systems. However, in general, the LDPC code often causes an error floor, and thus a concatenated encoding configuration and concatenated decoding configuration, in which an outer code, for example, a BCH code is added, is adopted in many cases.

Also in this case, it is possible to use configurations similar to those of the first and second embodiments. Now, in a third embodiment of the present invention, a description is given of an error correction device having a concatenated encoding configuration and concatenated decoding configuration in which an outer code is added.

Figure 4:
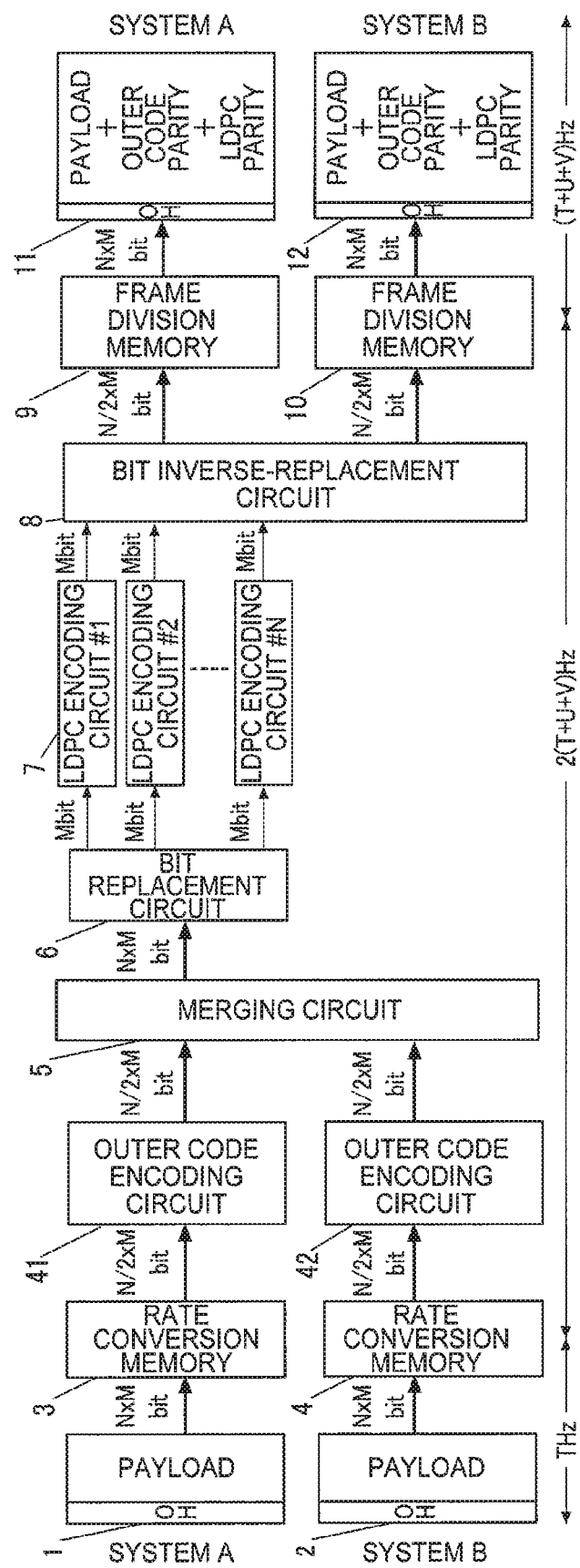
FIG. 4 is a block diagram for illustrating an exemplary configuration of concatenated encoding by an error correction device according to a third embodiment of the present invention.

FIG. 4 is a block diagram for illustrating an exemplary configuration of concatenated encoding by an error correction device according to the third embodiment of the present invention. Specifically, the configuration of FIG. 4 is different from the configuration of FIG. 1 in that outer code encoding circuits 41 and 42 are newly inserted. Thus, the following description is mainly given of this difference.

In FIG. 4, the outer code encoding circuits 41 and 42 are inserted between the rate conversion memories 3 and 4 of FIG. 1 and the merging circuit 5 for respective systems.

In output from the rate conversion memories 3 and 4, a parity region for an outer code is also inserted in such a manner as to be handled as the information bit of an LDPC code in addition to an OH and a payload. Thus, a clock between the rate conversion memories 3 and 4 and the frame division memories 9 and 10 is 2×(T+U+V) Hz, which is obtained by adding an increase of V Hz of the outer code parity region. Further, transmission clocks after being output from the frame division memories 9 and 10, that is, transmission clocks of respective systems after encoding are (T+U+V) Hz.

The number of parity bits of an outer code is assumed to be a multiple of M, and insertion of an outer code is handled by increasing the number of clocks.

Figure 5:
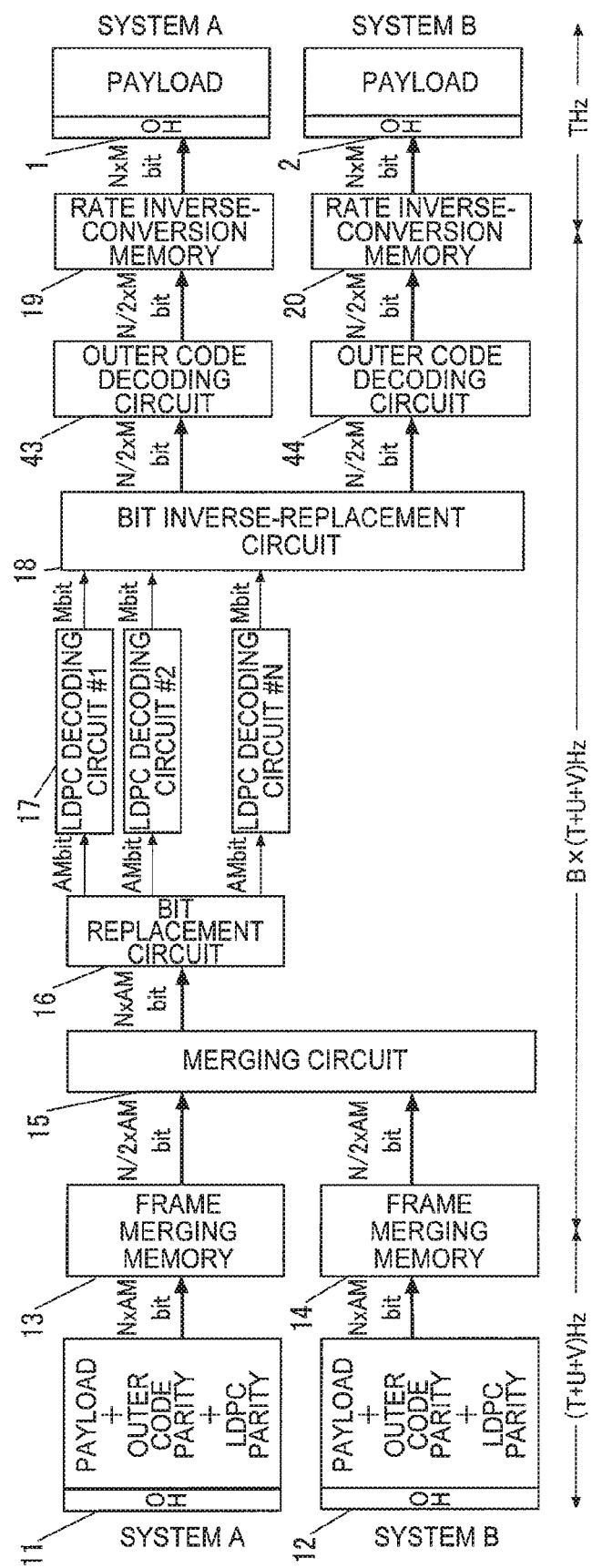
FIG. 5 is a block diagram for illustrating an exemplary configuration of concatenated decoding by the error correction device according to the third embodiment of the present invention.

Meanwhile, FIG. 5 is a block diagram for illustrating an exemplary configuration of concatenated decoding by an error correction device according to the third embodiment of the present invention. Specifically, the configuration of FIG. 5 is different from that of FIG. 3 in that outer code decoding circuits 43 and 44 are newly inserted. Thus, the following description is mainly given of this difference.

In FIG. 5, the outer code decoding circuits 43 and 44 are inserted between the bit inverse-replacement circuit 18 and the rate inverse-conversion memories 19 and 20 of FIG. 3 for respective systems in association with a frame having the concatenated encoding configuration of FIG. 4.

In output from the frame merging memories 13 and 14, a parity region for an outer code is also inserted in such a manner as to be handled as the information bit of an LDPC code in addition to an OH, a payload, and an LDPC parity. Thus, a clock between the frame merging memories 13 and 14 and the rate inverse-conversion memories 19 and 20 is B×(T+U+V) Hz, which is obtained by adding the increase of V Hz of the outer code parity region. Further, transmission clocks after being output from the rate inverse-conversion memories 19 and 20, that is, transmission clocks of respective systems after decoding are T Hz.

As described above, according to the third embodiment, it is possible to change the encoding configuration described in the first embodiment and the decoding configuration described in the second embodiment to the concatenated encoding configuration and the concatenated decoding configuration to which an outer code is added. In this manner, it is possible to monitor a result of possibility of error correction for each system by inserting an outer code for each system.

In the concatenated encoding configuration illustrated in FIG. 4, the outer code encoding circuits 41 and 42 are inserted into the former stage of the merging circuit 5 for respective systems. In contrast, it is also possible to implement the concatenated encoding configuration by inserting one encoding circuit for an outer code into the latter stage of the merging circuit 5.

In that case, on the concatenated decoding circuit side, the bit inverse-replacement circuit 18 outputs pieces of data as N×M bits, and inputs those pieces of data to the respective outer code decoding circuits 43 and 44. After that, pieces of data are output to the respective systems as N/2×M bits, and input to the rate inverse-conversion memories 19 and 20.

Further, in the third embodiment, a description has been given on the assumption that the number of parity bits for an outer code to be inserted in the middle is a multiple of M. However, it is possible to employ the configuration of using the number of parity bits for an outer code other than a multiple of M by modifying write or read by the rate conversion memories 3 and 4. However, in such a case, it is desired that a head reference point be enabled to be set in, for example, a frame header in addition to the number of LDPC parity bits.

Fourth Embodiment

In the first to third embodiments, a description has been given of an exemplary case of using an LDPC code, in particular, an LDPC convolutional code as an exemplary configuration of the error correction device configured to encode and decode an error correction code sequence in input in a plurality of systems. However, the error correction code that can be applied to the present invention may be other codes. Thus, in a fourth embodiment of the present invention, a supplementary description is given of an applicable code other than an LDPC code and an LDPC convolutional code.

For example, also with a general convolutional code, it is possible to employ an error correction device that adopts the configuration of the plurality of encoding circuits 7 illustrated in FIG. 1 and FIG. 4 and the configuration of the plurality of decoding circuits 17 illustrated in FIG. 3 and FIG. 5 even when the transmission rate changes for a continuous code sequence.

Further, interleaving is not always required to replace bits. Interleaving that replaces symbols can be adopted in, for example, an RS symbol, depending on the characteristic of a relevant code.

Further, in the first to third embodiments, it is assumed that each of the N encoding circuits 7 and each of the N decoding circuits 17 use the same parameter code. However, the error correction device according to the present invention can exhibit a similar effect also when each of the N encoding circuits 7 and each of the N decoding circuits 17 use a different code and a different code parameter.

REFERENCE SIGNS LIST 1, 2 frame (payload), 3, 4 rate conversion memory, 5 merging circuit, 6 bit replacement circuit, 7 LDPC encoding circuit, 8 bit inverse-replacement circuit, 9, 10 frame division memory, 11, 12 frame (payload), 13, 14 frame merging memory, 15 merging circuit, 16 bit replacement circuit, 17 LDPC decoding circuit, 18 bit inverse-replacement circuit, 19 rate inverse-conversion memory, 41, 42 outer code encoding circuit, 43, 44 outer code decoding circuit

The invention claimed is:

1. An error correction device, comprising at least one of:
an encoder configured to encode two or more payloads into a plurality of error correction code sequences by calculating parity bits from the two or more payloads based on a predetermined rule, the parity bits being positioned amongst information bits of the two or more payloads within two or more payload frames to be transmitted; and
a decoder configured to decode the plurality of error correction code sequences encoded by the encoder, by executing decoding processing that
corrects errant information bits in the two or more payload frames transmitted from the encoder, on the basis of the parity bits in the transmitted two or more payload frames and the predetermined rule, and
outputs the two or more payloads including the corrected information bits,
wherein the encoder includes a predetermined plurality of encoder circuits connected in parallel, and is configured to execute encoding processing for the plurality of error correction code sequences through use of all the predetermined plurality of encoder circuits by inputting each of the two or more payloads into a rate-conversion memory via a first bus and according to a first clock signal, and outputting each of the one or two payloads from the rate-conversion memory via a second bus and according to a second clock signal, the first and second buses having different bus widths and the first and second clock signals having different frequencies, thereby adjusting a bus width and a frequency of an operation clock with respect to a difference in a first transmission rate associated with a situation where a single payload is inputted into the encoder and a second transmission rate associated with a situation where the two or more payloads are inputted into the encoder, and wherein the decoder includes a predetermined plurality of decoder circuits connected in parallel, and is configured to execute the decoding processing for the plurality of error correction code sequences in the transmitted two or more payload frames through use of all the predetermined plurality of decoder circuits by inputting each of the transmitted two or more payload frame into a frame-merging memory via a third bus and according to a third clock signal, and outputting each of the transmitted two or more payload frames from the frame-merging memory via the fourth bus according to the fourth clock signal, the third and fourth buses having different bus widths and the third and fourth clock signals having different frequencies, thereby adjusting a bus width and a frequency of an operation clock with respect to the difference in the first transmission rate and the second transmission rate.

2. The error correction device according to claim 1, wherein the plurality of error correction code sequences are subjected to interleaving in units of bit or symbol with respect to a transmission order among data buses to which the plurality of error correction code sequences are input.

3. The error correction device according to claim 1, wherein the plurality of error correction code sequences include LDPC codes.

4. The error correction device according to claim 3, wherein the plurality of error correction code sequences include LDPC convolutional codes.

5. The error correction device according to claim 1, wherein the difference in transmission rate is handled based on a number of input systems of a payload.

6. The error correction device according to claim 1, wherein the predetermined plurality of encoders are configured to execute the encoding processing after adding an outer code to the payload.

7. An error correction method, which is executed by an error correction device including at least one of:
an encoder configured to encode two or more payloads into a plurality of error correction code sequences by calculating parity bits from the two or more payloads based on a predetermined rule, the parity bits being positioned amongst information bits of the two or more payloads within two or more payload frames to be transmitted; and
a decoder configured to decode the plurality of error correction code sequences encoded by the encoder, by executing decoding processing that
corrects errant information bits in the two or more payload frames transmitted from the encoder, on the basis of the parity bits in the transmitted two or more payload frames and the predetermined rule, and
outputs the two or more payloads including the corrected information bits,
the error correction method comprising:
an encoding step of executing encoding processing for the plurality of error correction code sequences through use of parallel processing using all a predetermined plurality of encoding processing units by inputting each of the two or more payloads into a rate-conversion memory via a first bus and according to a first clock signal, and outputting each of the one or two payloads from the rate-conversion memory via a second bus and according to a second clock signal, the first and second buses having different bus widths and the first and second clock signals having different frequencies, thereby adjusting an output bus width and a frequency of an operation clock with respect to a difference in transmission rate for any one of a payload input in one system and payloads input in two or more systems; and
a decoding step of executing decoding processing for the plurality of error correction code sequences through use of parallel processing using all a predetermined plurality of decoding processing units by adjusting an output bus width and a frequency of an operation clock with respect to a difference in transmission rate for any one of a payload input in one system and payloads input in two or more systems.

8. The error correction method according to claim 7, wherein the encoding step includes executing, at a time of the parallel processing, interleaving processing through replacement in units of bit or symbol among data buses to which the plurality of error correction code sequences are input in parallel.

9. The error correction method according to claim 7, wherein the decoding step includes executing, at a time of the parallel processing, interleaving processing through replacement in units of bit or symbol among data buses to which the plurality of error correction code sequences are input in parallel.

* * * * *